US008541303B2

(12) United States Patent
Lai et al.

(10) Patent No.: US 8,541,303 B2

(45) Date of Patent: Sep. 24, 2013

(54) METHOD FOR FABRICATING MOS TRANSISTOR

(75) Inventors: Kuo-Chih Lai, Tainan (TW); Nien-Ting Ho, Tainan (TW); Shu Min Huang, Tainan (TW); Bor-Shyang Liao, Kaohsiung (TW); Chia Chang Hsu, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 127 days.

(21) Appl. No.: 13/246,880

(22) Filed: Sep. 28, 2011

(65) Prior Publication Data

US 2013/0078800 A1 Mar. 28, 2013

(51) Int. Cl.
*H01L 21/44* (2006.01)

(52) U.S. Cl.
USPC .................... 438/653; 438/655; 257/E21.584

(58) Field of Classification Search
USPC .......................... 438/653, 655; 257/E21.584
See application file for complete search history.

(56) References Cited

U.S. PATENT DOCUMENTS

| | | | | |
|---|---|---|---|---|
| 5,998,873 | A | 12/1999 | Blair | |
| 6,482,739 | B2 * | 11/2002 | Wu | 438/664 |
| 7,214,620 | B2 | 5/2007 | Kim | |
| 2010/0040768 | A1 | 2/2010 | Dhindsa | |
| 2010/0178764 | A1 | 7/2010 | Narita | |
| 2011/0104893 | A1 * | 5/2011 | Zhang et al. | 438/653 |

* cited by examiner

*Primary Examiner* — Phuc Dang

(74) *Attorney, Agent, or Firm* — Winston Hsu; Scott Margo

(57) ABSTRACT

A method for fabricating metal-oxide semiconductor (MOS) transistor is disclosed. The method includes the steps of: providing a semiconductor substrate having a silicide thereon; performing a first rapid thermal process to drive-in platinum from a surface of the silicide into the silicide; and removing un-reacted platinum in the first rapid thermal process.

6 Claims, 4 Drawing Sheets

126 126 126 124 122 107 118 108 118 120 128 110 110 112 100 112

METHOD FOR FABRICATING MOS TRANSISTOR

BACKGROUND OF THE INVENTION

1. Field of the Invention

The invention relates to a method for fabricating MOS transistor, and more particularly, to a method of using rapid thermal process to drive-in platinum from surface of silicide layer into the silicide layer.

2. Description of the Prior Art

Field effect transistors are important electronic devices in the fabrication of integrated circuits, and as the size of the semiconductor device becomes smaller and smaller, the fabrication of the transistors also improves and is constantly enhanced for fabricating transistors with smaller sizes and higher quality.

In the conventional method of fabricating transistors, a gate structure is first formed on a substrate, and a lightly doped drain (LDD) is formed on the two corresponding sides of the gate structure. Next, a spacer is formed on the sidewall of the gate structure and an ion implantation process is performed to form a source/drain region within the substrate by utilizing the gate structure and spacer as a mask. In order to incorporate the gate, source, and drain into the circuit, contact plugs are often utilized for interconnection purposes, in which the contact plugs are composed of conducting metals such as tungsten and copper. Nevertheless, the interconnection between the contact plugs and the silicon material of the gate structure and the source/drain region is usually poor, hence a silicide material is often formed over the surface of the gate structure and the source/drain region to improve the ohmic contact between the contact plugs and the gate structure and the source/drain region.

Today, the process known as self-aligned silicide (salicide) process has been widely utilized to fabricate silicide materials, in which a source/drain region is first formed, a metal layer comprised of cobalt, titanium, or nickel is disposed on the source/drain region and the gate structure, and a first rapid thermal process (RTP) is performed to react the metal layer with the silicon contained within the gate structure and the source/drain region to form a silicide layer. After using a sulfuric acid-hydrogen peroxide mixture (SPM) cleaning to remove un-reactive nickel from the first rapid thermal process, a second RTP is conducted to reduce the sheet resistance of the silicide layer.

Unfortunately, the cleaning process conducted between the aforementioned first and second RTP typically removes un-reacted metal entirely. Even if some metals remained after the cleaning process, they are preferably concentrated relative to the surface of the silicide and could not penetrate into the interface between the silicide and the semiconductor substrate. This causes a junction leakage between the PN junction of the source/drain region and the silicon substrate and the silicide being formed and results in a piping phenomenon. Hence, how to effectively resolve this issue has become an important task.

SUMMARY OF THE INVENTION

It is an objective of the present invention to provide a method of fabricating MOS transistor to resolve the above issue of junction leakage during a salicide process.

According to a preferred embodiment of the present invention, a method for fabricating metal-oxide semiconductor (MOS) transistor is disclosed. The method includes the steps of: providing a semiconductor substrate having a silicide thereon; performing a first rapid thermal process to drive-in platinum from a surface of the silicide into the silicide; and removing un-reacted platinum in the first rapid thermal process.

Another aspect of the present invention provides a method for fabricating MOS transistor. The method includes the steps of: providing a semiconductor substrate, wherein the semiconductor substrate comprises a source/drain region thereon; forming a Ni-Pt layer and a barrier layer on the source/drain region; performing a first rapid thermal process to form part of the Ni-Pt layer and the source/drain region into a silicide; removing un-reacted nickel and barrier layer from the first thermal process; performing a second rapid thermal process to drive-in platinum from a surface of the silicide into the silicide; removing un-reacted platinum from the second rapid thermal process; and performing a third rapid thermal process for lowering the resistance of the silicide.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
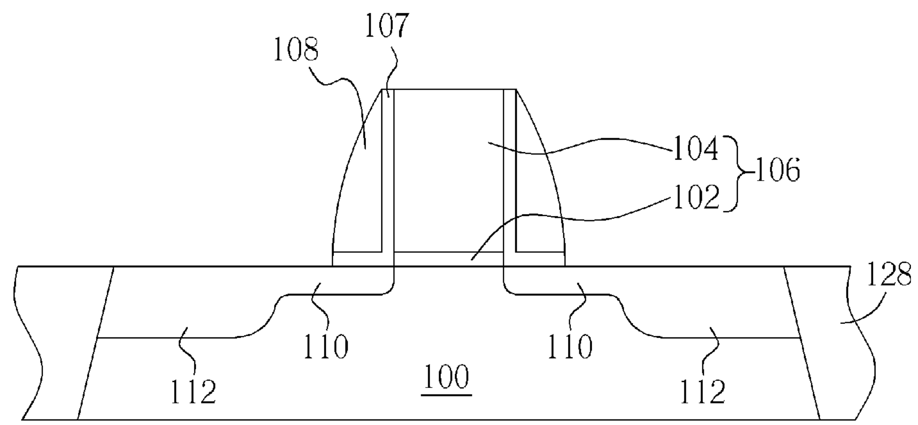
FIGS. 1-3 illustrate a method for fabricating a MOS transistor according to a preferred embodiment of the present invention.
Figure 2:
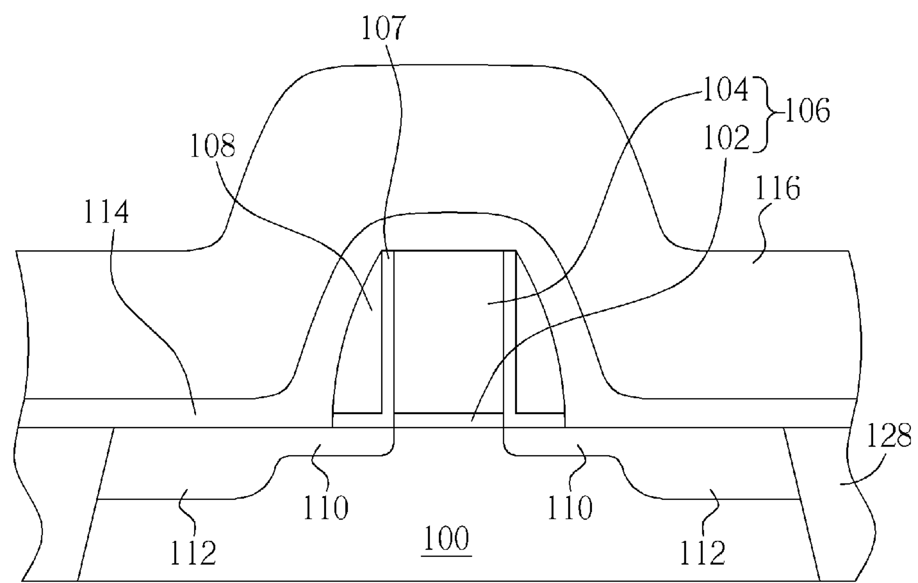
Figure 3:
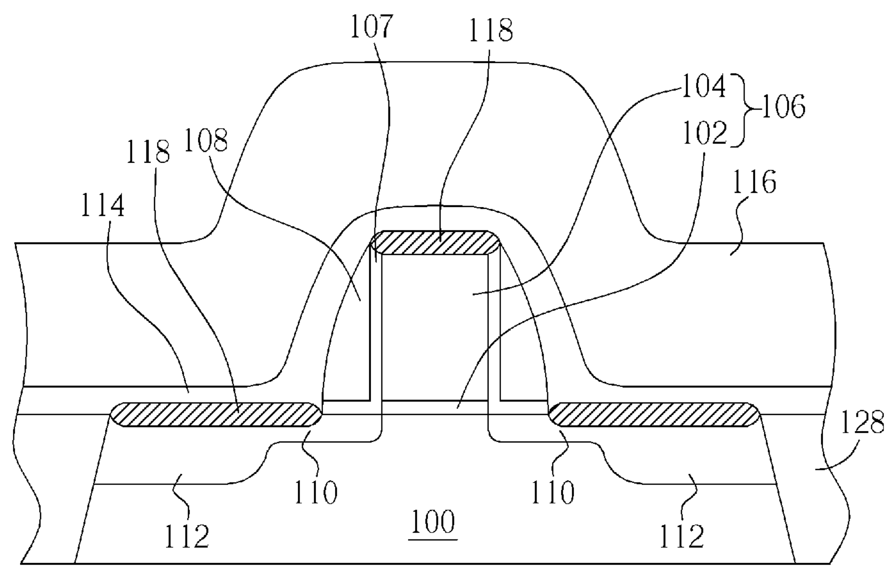

Referring to FIGS. 1-3, FIGS. 1-3 illustrate a method for fabricating a MOS transistor according to a preferred embodiment of the present invention. As shown in FIG. 1, a semiconductor substrate 100, such as a wafer or a silicon-on-insulator (SOI) substrate is provided. Preferably, the semiconductor substrate 100 may include silicon structures such as gate electrode, source/drain regions, isolation regions, word lines, diodes, fuses, or resistors depending on different product demands and fabrication processes. According to the preferred embodiment of the present invention, a gate structure 106, source/drain region 112, and isolating region 128 of a MOS transistor are exemplified in this embodiment. As shown in FIG. 1, the gate structure 106 includes a gate dielectric layer 102 and gate electrode 104. The gate dielectric layer 102 is preferably composed of insulating material such as silicon nitrides, oxides, oxynitrides, or metal oxides, and the gate conductive layer 104 is composed of conductive material such as doped polysilicon, silicides, metal compounds or other metals.

Next, a lightly doped ion implantation process is performed by using the gate electrode 104 as mask to implant dopants into the semiconductor substrate 100 adjacent to two sides of the gate conductive layer 104 for forming a source/drain extension or a lightly doped source/drain 110. The implanted dopants are preferably selected according to the type of MOS transistor being fabricated. For instance, n-type dopants including phosphorus or arsenic would be implanted for fabricating a NMOS transistor, whereas p-type dopants including boron would be used for a PMOS transistor. Additionally, a spacer (not shown) could be selectively formed on the sidewall of the gate structure 106 through hot oxidation prior to the formation of the source/drain extension or the lightly doped source/drain 110. By doing so, this selectively formed spacer and the gate electrode 104 could be using as a mask during the lightly doped ion implantation process.

A liner 107 composed of silicon oxide and one or more spacer 108 composed of silicon nitride compound are selectively formed on the sidewall of the gate structure 106, in which the liner 107 and the spacer 108 could be composed of any dielectric material. Next, a heavily doped ion implantation is performed by using the gate electrode 104 and the spacer 108 as mask to implant heavy dopants into the semiconductor substrate 100 for forming a source/drain region 112. Similar to the ion implantation conducted for the aforementioned lightly doped source/drain 110, dopants implanted for a NMOS transistor would include phosphorus or arsenic, whereas dopants implanted for a PMOS transistor would include boron. Next, a thermal annealing process is performed by using a temperature between 1000° C. to 1050° C. to activate the dopants within the semiconductor substrate 100 and repair the damage of the crystal lattice structure of the semiconductor substrate 100 caused during the ion implantation process.

In addition to the aforementioned process, the order for fabricating the spacer, the lightly doped source/drain and the source/drain region could be adjusted according to the demand of the product, which are all within the scope of the present invention. For instance, in one embodiment, one or more spacer could be formed, the source/drain is formed thereafter, and after removing the spacer or the outer most layer of the spacer, ion implantation is conducted to form the lightly doped drain region. In another embodiment, two recesses could be formed in the substrate with respect to two sides of the gate structure prior to the formation of the source drain region, and an epitaxial layer could be grown through selective epitaxial growth process in the two recesses thereafter. The epitaxial layer is preferably composed of material suitable for NMOS transistor, such as SiC, or material suitable for PMOS transistor, such as SiGe.

Next, a salicide process is conducted to form silicide layers. As shown in FIG. 2, a pre-clean could be selectively conducted to remove native oxide or other impurities from the surface of the gate structure 106 and the source/drain region 112, and then a thin film deposition process is conducted to deposit a metal layer 114 with approximately 150~200 Angstroms and a barrier layer 116 with approximately 100~200 Angstroms composed of TiN on the surface of the gate structure 106 and the source/drain region 112. The metal layer 114 preferably comprises a first metal comprising platinum (Pt), nickel (Ni), cobalt (Co), titanium (Ti) or alloys of the aforementioned metals used to form silicide and, a second metal comprising Pt, Co, palladium (Pd), manganese (Mn), tantalum (Ta), ruthenium (Ru) or alloys of the aforementioned metals in a low concentration. The second metal is added with a concentration of 3-8% (wt %) and is preferably used to improve a thermal stability of the salicide and prevent the salicide from agglomeration which increases contact resistance and junction leakage. In this embodiment, the first metal is Ni and the second metal is Pt. However, in a modification of the preferred embodiment, the first metal is not limited to Ni, but can be Co or Pt; and, the second metal used to improve thermal stability is not limited to Pt, but can also be Pd, Mo, Ta, or Ru. Next, a first rapid thermal process (RTP) is performed to react the metal layer 114 with silicon in the gate structure 106 and the source/drain 112 and to form transitional silicides 118 while defining the thickness of the silicides 118 simultaneously. These processes are well known to those skilled in the art and further detailed description is therefore omitted here for brevity.

Figure 4:
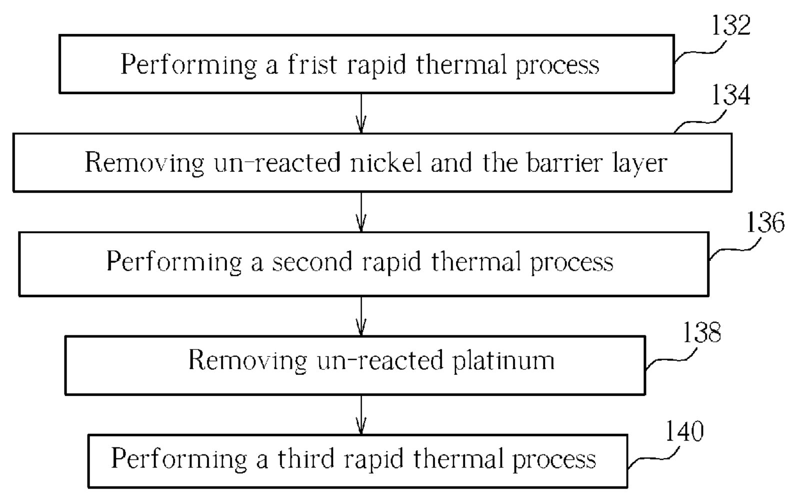
FIGS. 4 is a flow chart diagram illustrating the process after the aforementioned first RTP according to the preferred embodiment of the present invention.
Figure 5:
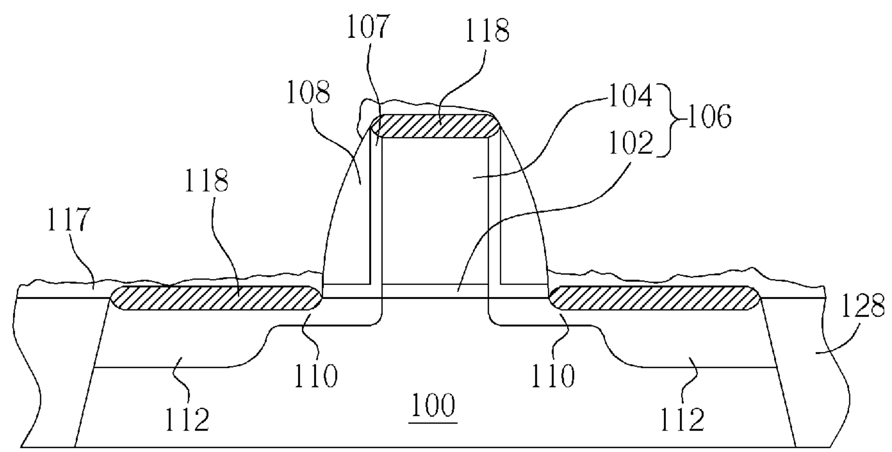
FIGS. 5-8 are perspective diagrams illustrating fabrication process conducted after the second RTP.
Figure 6:
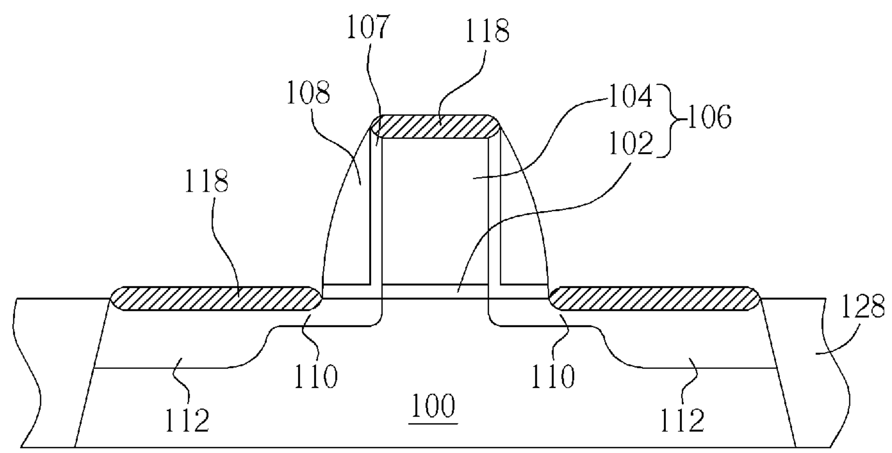
Figure 7:
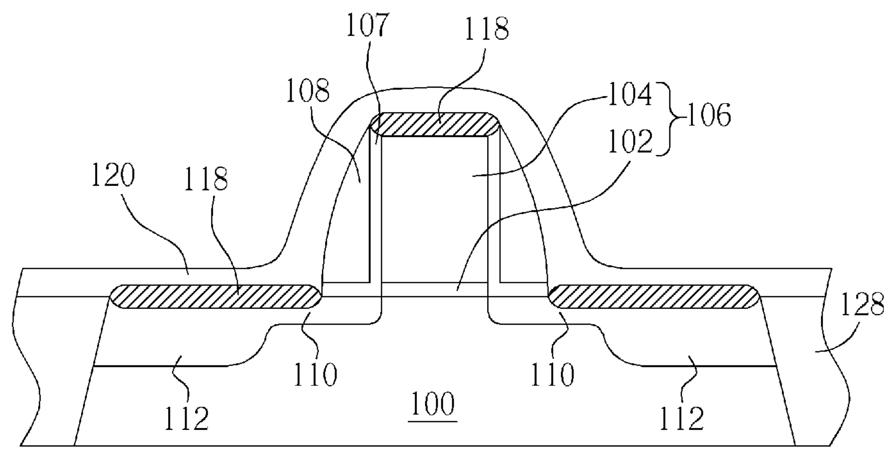

Referring to FIGS. 4-7, FIGS. 4 is a flow chart diagram illustrating the process after the aforementioned first RTP according to the preferred embodiment of the present invention, and FIGS. 5-7 are perspective diagrams illustrating fabrication process corresponding FIG. 4. As shown in the figures presented, step 132 is first carried out to perform the first RTP for reacting the Ni—Pt metal layer with silicon to form integrated silicides. In this embodiment, the temperature of the first RTP is lower than 300° C., preferably between 240° C. to 290° C., and the duration of the first rapid thermal process is between 30 seconds to 120 seconds, and preferably at 45 seconds.

In step 134, a sulfuric acid-hydrogen peroxide mixture (SPM) cleaning process is performed to remove the barrier layer 116 composed of TiN and un-reacted nickel metal from the first RTP, as shown in FIG. 5. Preferably, some of unreacted platinum metal 117 would remain on the surface of the transitional silicides 118. In this embodiment, the duration of the SPM cleaning process is between 500 seconds to 700 seconds, and preferably at 600 seconds. The temperature of the SPM cleaning process is preferably at 95° C., and the volume percent of sulfuric acid to hydrogen peroxide in SPM is preferably 800:200.

In step 136, a second RTP is performed to drive-in the remaining platinum metal from the surface of the silicide 118 into the silicide 118, such as to the boundary between the silicide 118 and the source/drain region 112. By using the platinum as barrier, the present invention could prevent nickel atoms from penetrating into the substrate 100 to cause junction leakage and piping phenomenon. In this embodiment, the fabrication parameters of the second RTP is similar to the ones used in the first RTP, such that the temperature of the second RTP is between 240° C. to 290° C., and the duration of the second RTP is between 30 seconds to 120 seconds.

In step 138, a hydrochloric acid-hydrogen peroxide mixture (HPM) cleaning process is conducted to remove unreactive and remaining platinum from the second RTP. It should be noted that this cleaning process preferably removes the platinum remained on the surface of the transitional silicide 118 while not affecting any of the platinum being driven into the silicide 118 and the overall thickness of the transitional silicide 118 is remained the same. In this embodiment, the duration of the HPM cleaning process is between 210 seconds to 410 seconds, and preferably at 310 seconds. The temperature of the HPM cleaning process is preferably at 50° C., and the volume percent of hydrochloric acid to hydrogen peroxide in HPM is preferably 800:600. Thereafter, another cleaning process could be carried out selectively by using SPM to remove remaining barrier layer 116 and un-reacted nickel metal.

Next, an ammonia hydrogen peroxide mixture (APM) cleaning process could be selectively conducted to remove remaining particles from the surface of the semiconductor substrate 100. In this embodiment, the duration of the APM cleaning process is between 20 seconds to 220 seconds, and preferably at 120 seconds. The temperature of the APM cleaning process is preferably at 60° C., and the volume percent of ammonia, hydrogen peroxide, and water in APM is preferably 60:120:2400.

In step 140, a third RTP is conducted to transform the transitional silicide 118 into a silicide layer with lower sheet resistance. In this embodiment, the third RTP is preferably a spike anneal process, and the temperature of this process is greater than 300° C., and preferably between 400° C. to 500° C.

After the third RTP is conducted, as shown in FIG. 7, a contact etch stop layer (CESL) 120 is formed on top of the silicide layer 118 as no extra cleaning process is performed between the second RTP and the formation of the CESL 120. The material of the CESL 120 is preferably dependent upon the nature of the NMOS or PMOS transistor, such that the CESL 120 could either be a CESL 120 with tensile stress or compressive stress.

Figure 8:
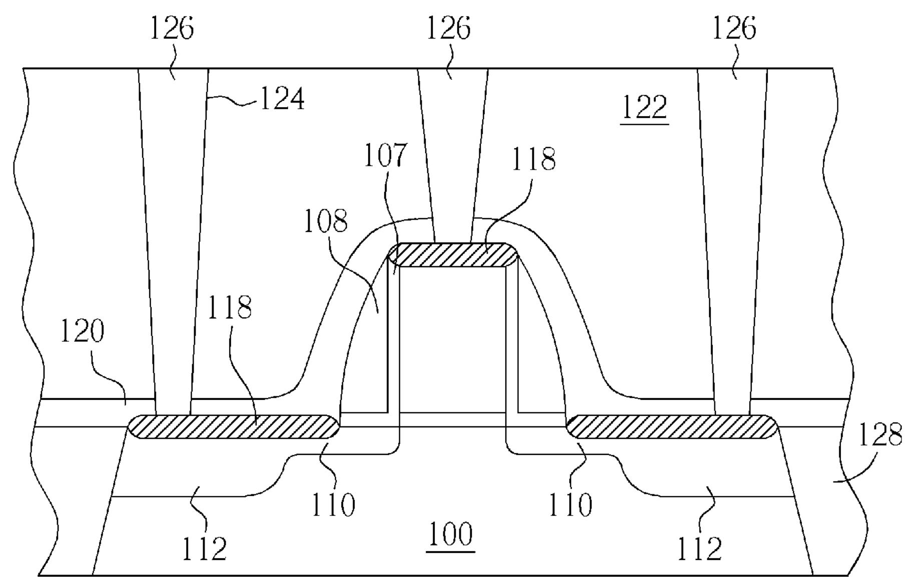

As shown in FIG. 8, an interlayer dielectric layer 122 composed of oxides is deposited on the semiconductor substrate 100 to cover the CESL 120. The interlayer dielectric layer 122 could be composed of nitrides, oxides, carbides, low-k dielectric material or combination thereof.

Next, a contact plug fabrication is performed by using a patterned photoresist (not shown) as mask to etch through the interlayer dielectric layer 122 and the CESL 120 for forming a plurality of contact openings 124 exposing the silicide layer 118 on top of the gate structure 106 and the source/drain region 112. A metal composed of tungsten, TiN or other conductive material is then deposited in the contact openings 124 for forming a plurality of contact plugs 126 electrically connecting the silicide layer 118. This completes the formation of a MOS transistor with silicides.

It should be noted that before the contact plug fabrication, the aforementioned process could be integrated with a gate-last for high-k first or gate-last for high-k last approach for forming metal gate transistors with high-k dielectric layer. Moreover, the process of the present invention could also be applied to salicide process in other semiconductor device, such as non-planar transistors including Fin-FETs.

As the cleaning process conducted between the two RTP steps in conventional approach typically removes platinum entirely, or leaving only part of platinum on the surface of the silicide without entering the interface region between the silicide and the silicon substrate, the present invention preferably conducts a RTP process after the removal of barrier layer and nickel from the silicide to drive-in platinum into an interface region between the bottom of silicide layer and semiconductor substrate, removes un-reacted platinum from the surface of the silicide, and then performs another RTP to transform transitional silicide into a silicide layer with lower resistance. By applying the aforementioned drive-in RTP process, the present invention could use the platinum between silicide and substrate as a barrier to prevent nickel atoms from the silicide entering the substrate to cause junction leakage and piping, thereby ensuring the quality of silicide being formed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating metal-oxide semiconductor (MOS) transistor, comprising:

providing a semiconductor substrate, wherein the semiconductor substrate comprises a source/drain region thereon;

forming a Ni—Pt layer and a barrier layer on the source/drain region;

performing a first rapid thermal process to form part of the Ni—Pt layer and the source/drain region into a silicide;

removing un-reacted nickel and barrier layer from the first thermal process;

performing a second rapid thermal process to drive-in platinum from a surface of the silicide into the silicide;

removing un-reacted platinum from the second rapid thermal process; and performing a third rapid thermal process for lowering the resistance of the silicide.

2. The method of claim 1, wherein the temperature of the first rapid thermal process and the second thermal process is between 240° C. to 290° C.

3. The method of claim 1, wherein the duration of the first rapid thermal process and the second rapid thermal process is between 30 seconds to 120 seconds.

4. The method of claim 1, wherein the temperature of the third rapid thermal process is higher than 300° C.

5. The method of claim 1, wherein the barrier layer comprises TiN.

6. The method of claim 1, further comprising:

using a sulfuric acid-hydrogen peroxide mixture (SPM) for removing un-reacted nickel and the barrier layer from the first rapid thermal process; and using a hydrochloric acid-hydrogen peroxide mixture (HPM) for removing un-reacted platinum from the second rapid thermal process.

* * * * *